(12) United States Patent
Ishikawa et al.

(10) Patent No.: US 7,292,117 B2
(45) Date of Patent: Nov. 6, 2007

(54) TEMPERATURE-COMPENSATED PIEZOELECTRIC OSCILLATOR

(75) Inventors: Masayuki Ishikawa, Ebina (JP); Atsushi Kiyohara, Chigasaki (JP)

(73) Assignee: Epson Toyocom Corporation (JP)

( * ) Notice: Subject to any disclaimer, the term of this patent is extended or adjusted under 35 U.S.C. 154(b) by 65 days.

(21) Appl. No.: 11/370,564

(22) Filed: Mar. 8, 2006

(65) Prior Publication Data

US 2006/0202772 A1   Sep. 14, 2006

(30) Foreign Application Priority Data

Mar. 9, 2005   (JP) .............................. 2005-066395

(51) Int. Cl.
*H03L 1/00*   (2006.01)
(52) U.S. Cl. ...................... 331/176; 331/175; 331/158; 331/116 R; 331/116 FE
(58) Field of Classification Search ................ 331/176, 331/158, 116 R, 116 FE, 175
See application file for complete search history.

(56) References Cited

U.S. PATENT DOCUMENTS 5,041,799 A * 8/1991 Pirez ........................... 331/44

7,154,351 B2   12/2006   Kawasaki

FOREIGN PATENT DOCUMENTS

| JP | 2003-122420 | 4/2003 |
|----|-------------|--------|
| JP | 2004-336373 | 11/2004 |
| JP | 2004-343733 | 12/2004 |
| KR | 2004-101240 | 12/2004 |

OTHER PUBLICATIONS

Communication from Korean Patent Office regarding counterpart application.

* cited by examiner

*Primary Examiner*—Arnold Kinkead
(74) *Attorney, Agent, or Firm*—Harness, Dickey & Pierce, P.L.C.

(57) ABSTRACT

A temperature compensated piezoelectric oscillator includes: an oscillation circuit that drives a piezoelectric element with a current; a direct-current-stopping fixed capacitor; a frequency-temperature compensated circuit that compensates the deviation of an oscillation frequency caused by a change of temperature; and a piezoelectric transducer which includes a piezoelectric element driven in a prescribed frequency; where the above elements are connected serially.

5 Claims, 11 Drawing Sheets

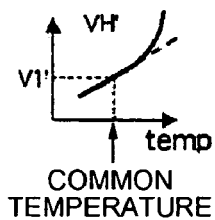
FIG. 4C(b)
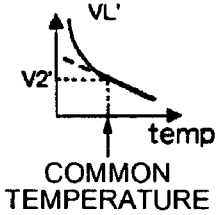
FIG. 4C(f)
CONTROL VOLTAGE
(PRESENT INVENTION)
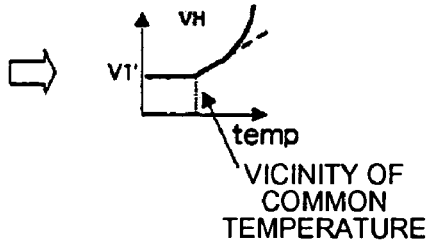
FIG. 4C(k)
FIG. 4C(m)
FURTHER IMPROVED
CONTROL VOLTAGE
(PRESENT INVENTION)
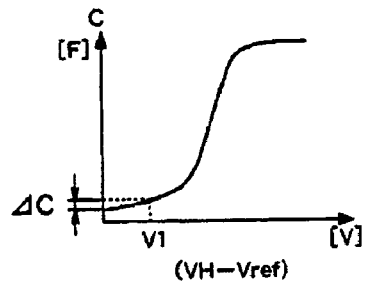
FIG. 4B
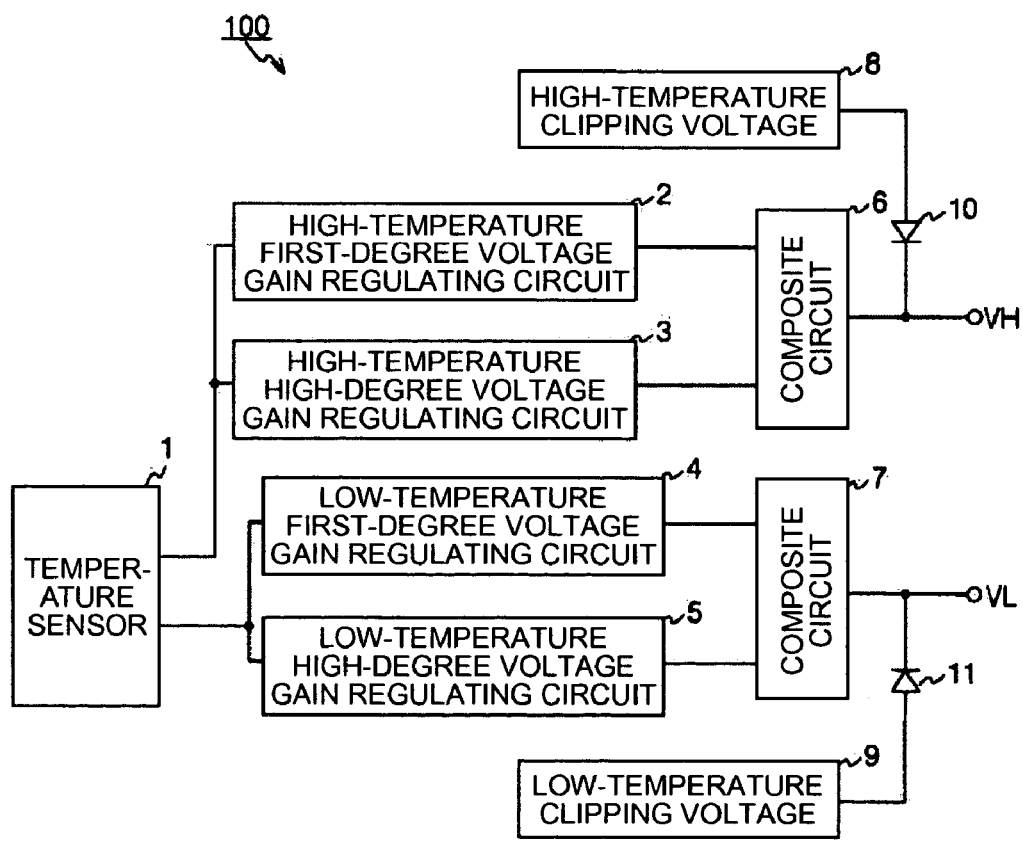
FIG. 4A

CONVENTIONAL
(TEMPERATURE COMPENSATION
RESULT WITH LINEAR FUNCTION ONLY)

PRESENT INVENTION
(TEMPERATURE COMPENSATION
RESULT WITH QUINTIC FUNCTION AS
DEGREE OF HIGH ORDER)

A: SENSOR VOLTAGE 1
B: SENSOR VOLTAGE 2
C: SENSOR VOLTAGE 3

TEMPERATURE-COMPENSATED PIEZOELECTRIC OSCILLATOR

BACKGROUND

1. Technical Field

The present invention relates to an oscillator that uses a piezoelectric element such as crystal, particularly to a temperature-compensated piezoelectric oscillator that allows temperature compensation of frequencies with a simple circuit configuration, and that is suitable for integrated circuits.

2. Related Art

In recent years, the requirements for piezoelectric elements, for instance oscillators that use crystal resonators, have been increasingly demanded not only for frequency stability, but also for a lower price and smaller oscillators. Further, as the digitalization of communication system progresses, the improvement of carrier-to-noise ratio (C/N property) characteristics, which has not posed a problem in the past, is now sought after. Output frequencies of an oscillator changes with various causes. Even in crystal oscillators that have relatively higher stability in frequencies, there is a frequency deviation caused by a change in the surrounding temperature, the power source voltage, or the output load, and the like. There are various ways to cope with it. For example, there is a temperature-compensated crystal oscillator (hereafter referred to as "TCXO") that copes with temperature change, in which: a temperature-compensated circuit is added to the crystal oscillator; the load capacity during oscillation loops is changed; and the load capacity is controlled in accordance with the temperature change so as to balance out the temperature-frequency characteristic unique to the crystal resonator.

FIG. 15A is a circuit diagram of a TCXO, conceivably provided by the same inventor. The TCXO shown in this example has a direct-current-stopping fixed capacitor C3, a temperature-compensated circuit 61, and a crystal resonator X connected serially to a Colpitts oscillation circuit 60. This temperature-compensated circuit 61 is organized including: a series circuit where a low-temperature compensation MOS capacitor ML and a sensitivity-adjusting fixed capacitor C4 are connected serially; and a parallel connection between a high-temperature compensation MOS capacitor MH and the series circuit. The polarities of the low-temperature compensation MOS capacitor ML and the high-temperature compensation MOS capacitor MH are opposite to each other. Moreover, a low-temperature section control voltage signal VL is supplied via an input resistor R4 to the mid-connection point between the anode terminal side of the low-temperature compensation MOS capacitor ML and the sensitivity-adjusting fixed capacitor C4, and a high-temperature section control voltage signal VH is supplied via an input resistor R5 to a gate terminal side of the high-temperature compensation MOS capacitor MH. Further, a reference voltage signal VREF is supplied via an input resister R6 to the gate terminal side of the low-temperature compensation MOS capacitor ML and to the anode terminal side of the high-temperature compensation MOS capacitor MH.

FIG. 15B includes graphs of the temperature-compensated voltages of the TCXO. The temperature compensation of the TCXO, according to aspects of the invention, utilizes a MOS varactor in order to perform a frequency-temperature compensation of the crystal resonator X. Since the capacitance deviation of the MOS varactor over temperature is similar to a behavior of a cubic function, the temperature compensation may be performed in a manner where the voltage applied to the MOS varactor behaves like a linear function over temperature. However, since the frequency-temperature characteristic of crystal resonators are subject to fluctuation, the temperature compensation with the MOS capacitance deviation does not always result in an ideal compensation curve, and the precision of the temperature compensation is not high. Therefore, the crystal resonators do not provide enough performance for the use of reference oscillators that require high stability in frequency, for instance, a GPS receiver.

FIG. 16B includes graphs expressing the temperature characteristic of the TCXO in FIG. 15. A solid line 62 (FIG. 16A) indicates the temperature characteristic of the crystal resonator X, and a dotted line 63 indicates the frequency variable characteristic over temperature, in the case where the temperature-compensated circuit 61 is controlled in the control voltage shown in FIG. 15B. As observed in the graphs, if the temperature-compensated circuit 61 is controlled with the control voltage shown in FIG. 15B, fine adjustment of curvature cannot be performed for the part where a rounded deviation of frequency is required. Hence, an ideal compensation control cannot be performed, or in other words, an ideal compensation curve cannot be obtained, in the compensation of a temperature characteristic 62 of the crystal resonator X, and the precision of the temperature characteristic after the temperature compensation is ±2 ppm.

In the technology conceivably provided above, since the non-linear capacitance deviation of the MOS varactor is similar to a curve expressed by a cubic function, the temperature compensation may be performed in a manner where the voltage applied to the MOS varactor behaves like a simple linear function. However, since the compensation curve therein is not ideal, the precision of the temperature compensation is not high. It is ideal that the MOS varactor MH in a high temperature (high-temperature compensation MOS capacitor MH), does not have frequency sensitivity in a low temperature. However, in actuality, there is a slight frequency sensitivity, and the control voltage in a high temperature (high-temperature section control voltage signal VH) has an effect in the low temperature. This involves a problem that the frequency adjustment becomes complicated, requiring, for example, to select a crystal resonator with specific frequency-temperature characteristic, in the case of products that require a high stability of frequency in a high precision.

SUMMARY

An advantage of some aspects of the invention is to provide a TCXO in which the temperature compensation precision is improved, by synthesizing the characteristic of a high-dimensional function into a characteristic of a linear function of a control voltage, in order to bring the compensation capacitance curve of the temperature-compensated circuit close to an ideal one, by utilizing a non-linear capacitance deviation of the MOS varactor.

Another advantage of some aspects of the invention is to make the control voltage in the low temperature constant above or at the common temperature, so that the control voltages of the high and low temperatures do not affect each other, and to make the control voltage of the high temperature constant below or at the common temperature, in order to ease the frequency adjustment in the case of products that require high precision.

According to a first aspect of the invention, a temperature compensated piezoelectric oscillator includes: an oscillation circuit that drives a piezoelectric element with a current; a direct-current-stopping fixed capacitor; a frequency-temperature compensated circuit that compensates the deviation of an oscillation frequency caused by a change of temperature; and a piezoelectric transducer which includes a piezoelectric element driven in a prescribed frequency; where the above elements are connected serially; wherein the frequency-temperature compensated circuit includes a temperature compensation voltage generation section which generates a voltage based on a parameter that is changed in a temperature detection unit, in which the parameter changes according to the surrounding temperature; wherein the temperature compensation voltage generation section includes: a low-temperature control voltage generation section which generates a voltage that compensates a temperature characteristic of the piezoelectric element in a low temperature, where "low" indicates temperatures lower than a common temperature in the temperature characteristic of the piezoelectric element; and a high-temperature control voltage generation section which generates a voltage that compensates the temperature characteristic of the piezoelectric element in a high temperature, where "high" indicates temperatures higher than a common temperature in the temperature characteristic of the piezoelectric element; wherein the low-temperature control voltage generation section includes: a low-temperature first-degree voltage generation circuit which generates the voltage that linearly changes with temperature; a low-temperature high-degree voltage generation circuit which generates the voltage that behaves like a high degree function in a low temperature state of the voltage generated by the low-temperature first-degree voltage generation circuit; and a low-temperature voltage composite circuit which synthesizes voltages generated by the low-temperature first-degree voltage generation circuit and the low-temperature high-degree voltage generation circuit; and wherein the high-temperature control voltage generation section includes: a high-temperature first-degree voltage generation circuit which generates the voltage that linearly changes with temperature; a high-temperature high-degree voltage generation circuit which generates the voltage that behaves like a high degree function in a high temperature state of the voltage generated by the high-temperature first-degree voltage generation circuit; and a high-temperature voltage composite circuit which synthesizes voltages generated by the high-temperature first-degree voltage generation circuit and the high-temperature high-degree voltage generation circuit.

In the above aspect of the invention, a control voltage that changes linearly and a voltage that behaves like a high degree function, are synthesized, in order to bring the characteristic of the MOS varactor to that of crystal resonators as much as possible, while a common method of temperature compensation has been performed using a control voltage that changes linearly. More specifically, the high-degree voltage generation circuits are provided, where one of which generates, for the low temperature side, a voltage that behaves like a high degree function in a low temperature state of the voltage, and the other generates, for the side of the high temperature, a voltage that behaves like a high degree function in a high temperature state of the voltage. By synthesizing the generated voltages with the control voltage that changes linearly, the control voltages for both low and high temperatures are generated and applied to the temperature-compensated circuit.

According to a second aspect of the invention, a temperature compensated piezoelectric oscillator includes: an oscillation circuit that drives a piezoelectric element with a current; a direct-current-stopping fixed capacitor; a frequency-temperature compensated circuit that compensates the deviation of an oscillation frequency caused by a change of temperature; and a piezoelectric transducer which includes a piezoelectric element driven in a prescribed frequency; where the above elements are connected serially; wherein the frequency-temperature compensated circuit includes a temperature compensation voltage generation section which generates a voltage based on a parameter that is changed in a temperature detection unit, in which the parameter changes according to the surrounding temperature; wherein the temperature compensation voltage generation section includes: a low-temperature control voltage generation section which generates a voltage that compensates a temperature characteristic of the piezoelectric element in a low temperature, where "low" indicates temperatures lower than a common temperature in the temperature characteristic of the piezoelectric element; and a high-temperature control voltage generation section which generates a voltage that compensates the temperature characteristic of the piezoelectric element in a high temperature, where "high" indicates temperatures higher than a common temperature in the temperature characteristic of the piezoelectric element; wherein the low-temperature control voltage generation section includes: a first low-temperature first-degree voltage generation circuit which generates a voltage that linearly changes in a first gradient with temperature; a second low-temperature first-degree voltage generation circuit which generates a voltage that linearly changes in a second gradient with temperature; and a low-temperature voltage composite circuit which synthesizes voltages generated by the first low-temperature first-degree voltage generation circuit and the second low-temperature first-degree voltage generation circuit; wherein the high-temperature control voltage generation section includes: a first high-temperature first-degree voltage generation circuit which generates the voltage that linearly changes with temperature in a first gradient; a second high-temperature first-degree voltage generation circuit which generates the voltage that linearly changes with temperature in a second gradient; and a high-temperature voltage composite circuit which synthesizes voltages generated by the first high-temperature first-degree voltage generation circuit and the second high-temperature first-degree voltage generation circuit.

In the above aspect of the invention, the two kinds of voltages that changes linearly are synthesized, in order to bring the characteristic of the MOS varactor to that of crystal resonators as much as possible, while a common method of temperature compensation has been performed using a control voltage that changes linearly. More specifically, two control voltages that change linearly in a low temperature are generated, and two other voltages that change linearly in high temperature are generated. By synthesizing these sets of two kinds of voltages that change linearly, the control voltages for both low and high temperatures are generated and applied to the temperature-compensated circuit.

According to a third aspect of the invention, a temperature compensated piezoelectric oscillator includes: an oscillation circuit that drives a piezoelectric element with a current; a direct-current-stopping fixed capacitor; a frequency-temperature compensated circuit that compensates the deviation of an oscillation frequency caused by a change of temperature; and a piezoelectric transducer which includes a piezoelectric element driven in a prescribed frequency; where the above elements are connected serially; wherein the frequency-temperature compensated circuit includes a temperature compensation voltage generation section which generates a voltage based on a parameter that is changed in a temperature detection unit, in which the parameter changes according to the surrounding temperature; wherein the temperature detection unit includes: a first sensor voltage generation circuit which generates the voltage that increases linearly as a temperature increases from the low temperature; a second sensor voltage generation circuit which generates the voltage that declines linearly as a temperature increases from the low temperature; and a third sensor voltage generation circuit which generates the voltage onto which a prescribed clipping voltage is added, having the same gradient as the voltage generated by the first sensor voltage generation circuit; wherein the temperature compensation voltage generation section includes: a low-temperature control voltage generation section which generates the voltage that compensates a temperature characteristic of the piezoelectric element in a low temperature, where "low" indicates temperatures lower than a common temperature in the temperature characteristic of the piezoelectric element; and a high-temperature control voltage generation section which generates the voltage that compensates the temperature characteristic of the piezoelectric element in a high temperature, where "high" indicates temperatures higher than a common temperature in the temperature characteristic of the piezoelectric element; wherein the low-temperature control voltage generation section includes: a low-temperature first-degree voltage generation circuit which generates the voltage that linearly changes, based on the second sensor voltage; a low-temperature high-degree voltage generation circuit which generates the voltage that behaves like a high degree function in a low temperature state of the voltage generated by the low-temperature first-degree voltage generation circuit, based on the second sensor voltage and the third sensor voltage; and a low-temperature voltage composite circuit which synthesizes voltages generated by the low-temperature first-degree voltage generation circuit and the low-temperature high-degree voltage generation circuit; and wherein the high-temperature control voltage generation section includes: a high-temperature first-degree voltage generation circuit which generates the voltage that linearly changes, based on the second sensor voltage; a high-temperature high-degree voltage generation circuit which generates the voltage that behaves like a high degree function in a high temperature state of the voltage generated by the high-temperature first-degree voltage generation circuit, based on the first sensor voltage and the second sensor voltage; and a high-temperature voltage composite circuit which synthesizes voltages generated by the high-temperature first-degree voltage generation circuit and the high-temperature high-degree voltage generation circuit According to the above aspect of the invention, in order to generate the more accurate high-degree voltage, a high-order current is generated by inputting the three kinds of sensor voltages into the high-degree voltage generation circuit (differential amplifier), thereafter the current is converted into a voltage, and consequently the control voltage is generated by synthesizing the voltage with a voltage generated by the first-degree voltage generation circuit.

In this case, in the low-temperature high-degree voltage generation circuit and the high-temperature high-degree voltage generation circuit, the degree of the function that represents the voltage may be changeable.

When configured with the differential amplifier, the amplification factor of the high-degree voltage generation circuits for low and high temperatures changes, by modifying the value of the resistor inserted in the differential amplifier. As a result, the amplification factor curve of the current changes, resulting in a change of the current characteristic with temperature; hence the virtual degree in a high degree function may be changed.

It is preferable that the low-temperature control voltage generation section generate the voltage that is constant in the temperature higher than a vicinity of the common temperature, and the high-temperature control voltage generation section generate the voltage that is constant in the temperature lower than the vicinity of the common temperature.

It is said that there is no problem if the control voltage deviates, since the MOS varactor for the high temperature section does not have frequency sensitivity in a low temperature. However, in actuality, there is a slight frequency sensitivity, and the control voltage VH, in a high temperature, (high-temperature section control voltage signal VH) has an effect in the low temperature section. Therefore, in order for the control voltages of the high and low temperatures not to affect each other, the control voltage in the low temperature is made to be constant above or at the common temperature, and the control voltage of the high temperature is made to be constant below or at the common temperature.

According to the first aspect of the invention, the low temperature control voltage and the high temperature control voltage are generated by synthesizing each of the first-degree control voltages of the low and high temperatures with the control voltage in a high-degree. Hence, the characteristic of the MOS varactor may be brought closer to that of crystal resonators.

According to the second aspect of the invention, the low temperature control voltage and the high temperature control voltage are generated by synthesizing two kinds of first-degree control voltages. Thus the control is simplified and the characteristic of the MOS varactor may be brought closer to that of crystal resonators.

According to the third aspect of the invention, the low temperature control voltage and the high temperature control voltage are generated by preparing three kinds of sensor voltages that are generated by the temperature sensor, and, based on the combinations thereof, generating and synthesizing the first-degree control voltages for low and high temperatures and the voltage with a high-degree. Therefore, the characteristic of the MOS varactor may be brought even closer to that of crystal resonators.

In this case, in the low-temperature high-degree voltage generation circuit and in the high-temperature high-degree voltage generation circuit, the degree of the function that represents the voltage may be changeable. Hence, the degree may be regulated externally, so that the characteristic of the MOS varactor may be regulated, in a fine manner, to that of crystal resonators.

It is preferable that the control voltage in the low temperature be constant in the temperature above or at the common temperature, and that the control voltage in the high temperature be constant in the temperature below or at the common temperature. Thus, the effect of the control voltages in low and high temperatures may be reduced.

BRIEF DESCRIPTION OF THE DRAWINGS

The invention will be described with reference to the accompanying drawings, wherein like numbers reference like elements.

FIGS. 4C(b), 4C(f), 4C(k), 4C(m) are graphs expressing the relationship between the temperature (temp) and the control voltage (V), where the outputs from composite circuits 6 and 7 in FIG. 3 are improved; FIG. 4A is a modified block diagram of function of a frequency-temperature compensated circuit that constitutes part of the temperature-compensated piezoelectric oscillator that is in accordance with the first embodiment of the invention; and FIG. 4B is a graph that illustrates the voltage-capacitance characteristics of a MOS varactor.

DESCRIPTION OF EXEMPLARY EMBODIMENTS

The present invention will now be described in detail using embodiments indicated in drawings. The elements, variation, combination, shape, and relational arrangement thereof, that are described in the embodiments, are for examples only, unless otherwise specifically described, and do not limit the scope of the invention thereto.

Figure 1:
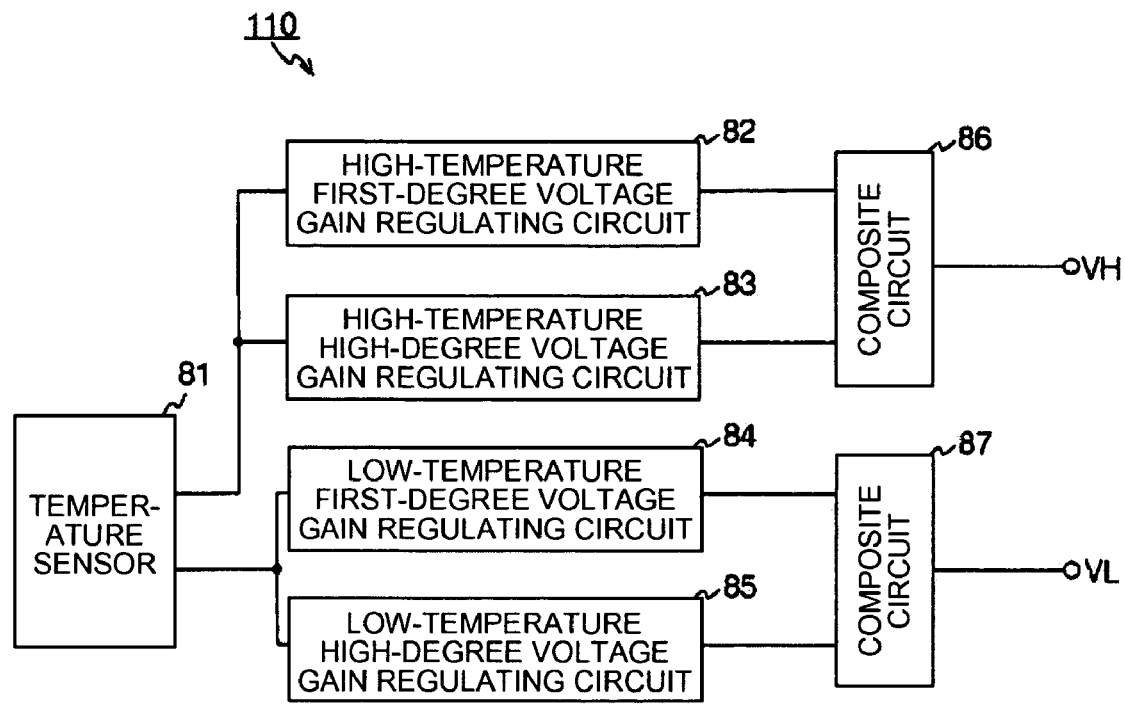
FIG. 1 is a block diagram of a function of a temperature-compensated voltage generation circuit that constitutes part of a temperature-compensated piezoelectric oscillator, according to a first embodiment of the present invention.

FIG. 1 is a block diagram of a function of a temperature-compensated voltage generation circuit that constitutes part of a temperature-compensated piezoelectric oscillator, according to a first embodiment of the present invention. This temperature-compensated voltage generation circuit 110 includes: a temperature sensor (temperature detection unit) 81, where the parameter thereof changes with the surrounding temperature; a high-temperature first-degree voltage gain regulating circuit (high-temperature first-degree voltage generation circuit) 82 which generates a voltage that changes linearly with temperature; a high-temperature high-degree voltage gain regulation circuit (high-temperature high-degree voltage generation circuit) 83 that generates the voltage that behaves like a high degree function in a high temperature state of the voltage generated by this high-temperature first-degree voltage gain regulating circuit 82; a composite circuit (high-temperature voltage composite circuit) 86 that synthesizes the voltages generated by the high-temperature first-degree voltage gain regulating circuit 82 and the high-temperature high-degree voltage gain regulating circuit 83; a low-temperature first-degree voltage gain regulation circuit 84 (low-temperature first-degree voltage generation circuit) which generates the voltage that linearly changes with temperature; a low-temperature high-degree voltage gain regulating circuit (low-temperature high-degree voltage generation circuit) 85 which generates the voltage that behaves like a high degree function in a low temperature state of the voltage generated by this low-temperature first-degree voltage gain regulating circuit 84; and a composite circuit (low-temperature voltage composite circuit) 87 that synthesizes the voltages generated by the low-temperature first-degree voltage gain regulating circuit 84 and the low-temperature high-degree voltage gain regulating circuit 85.

Figure 2:
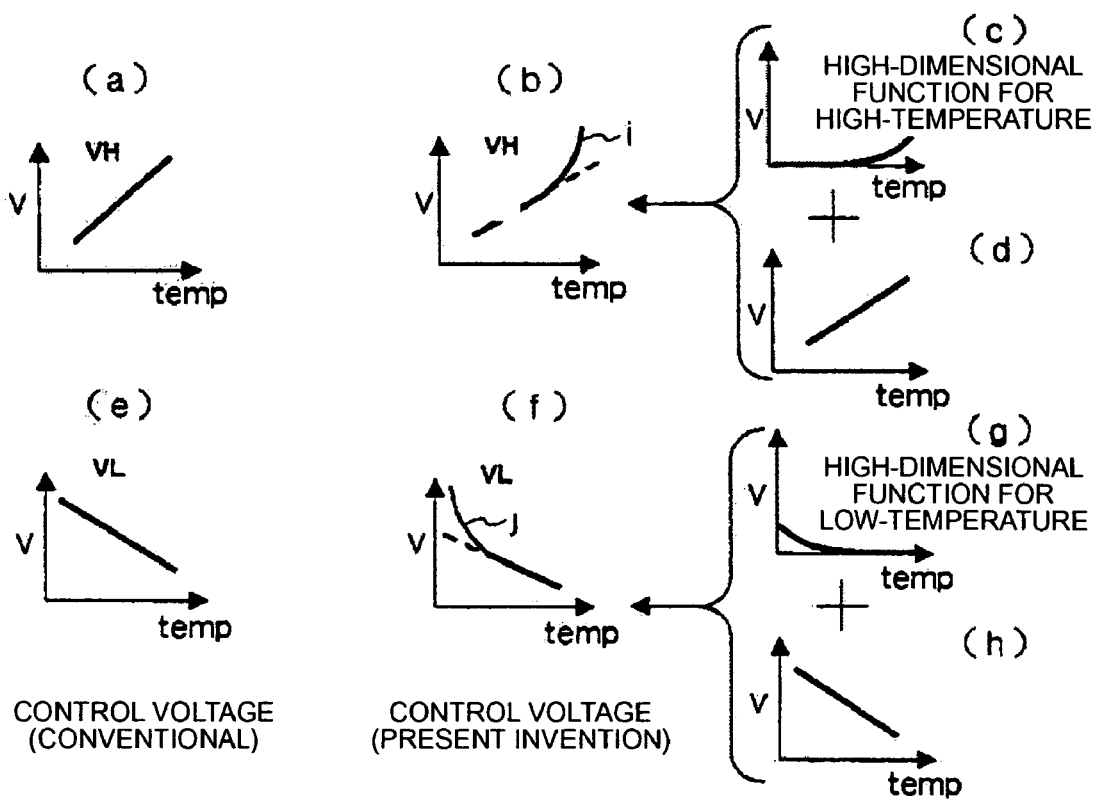
FIGS. 2(a) to 2(h) are graphs expressing the relationship between the temperature (temp) and the control voltage (V).
Figure 15A:
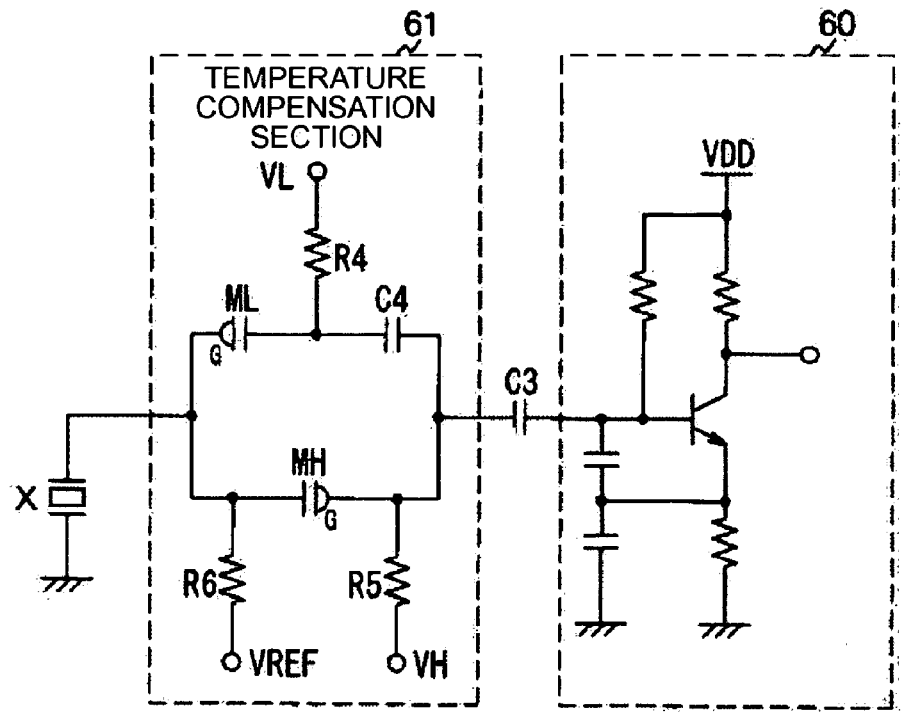
FIG. 15A is a circuit diagram of a temperature-compensated piezoelectric oscillator in the example of the related art, applied by the same inventor.
Figure 15B:
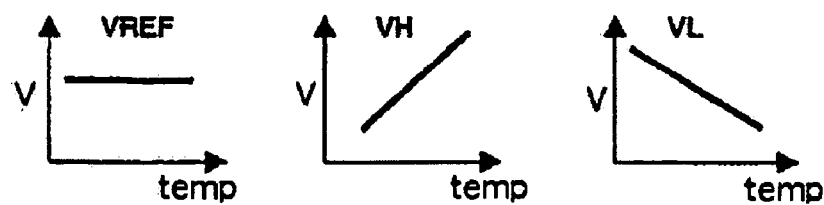
FIG. 15B includes graphs thereof.

FIGS. 2A to 2H are graphs expressing the relationship between the temperature (temp) and the control voltage (V). Hereafter, the "control voltage", according to the aspects of the invention, controls the temperature-compensated circuit 61 with a configuration illustrated in FIG. 15. FIGS. 2A and 2E represent a high temperature control voltage and a low temperature control voltage generated in accordance with a common technique, and FIGS. 2B and 2F represent a high temperature control voltage and a low temperature control voltage generated in accordance with the aspect of the invention. A first-degree voltage (FIG. 2D) that behaves like a linear function with temperature increase is generated as the high-temperature section control voltage signal VH by the high-temperature first-degree voltage gain regulating circuit 82. A high-degree voltage (FIG. 2C) that behaves like an exponential function with temperature increase is generated by the high-temperature high-degree voltage gain regulating circuit 83. These generated voltages are synthesized in the composite circuit 86, and the VH becomes the combination of the first-degree voltage and the high-degree voltage, which behaves, with temperature increase, like a linear function and an exponential function, as shown as "i" in FIG. 2B in its high-temperature side. A first-degree voltage (FIG. 2H) that behaves like a linear function with temperature decrease is generated as the low-temperature section control voltage signal VL by the low-temperature first-degree voltage gain regulating circuit 84. A high-degree voltage (FIG. 2G) that behaves like an exponential function with temperature decrease is generated by the low-temperature high-degree voltage gain regulating circuit 85. These generated voltages are synthesized in the composite circuit 87, and the VL becomes the combination of the first-degree voltage and the high-degree voltage, which behaves, with temperature decrease, like a linear function and an exponential function, as shown as "j" in FIG. 2F in its low-temperature side.

Figures 3A, 3B:
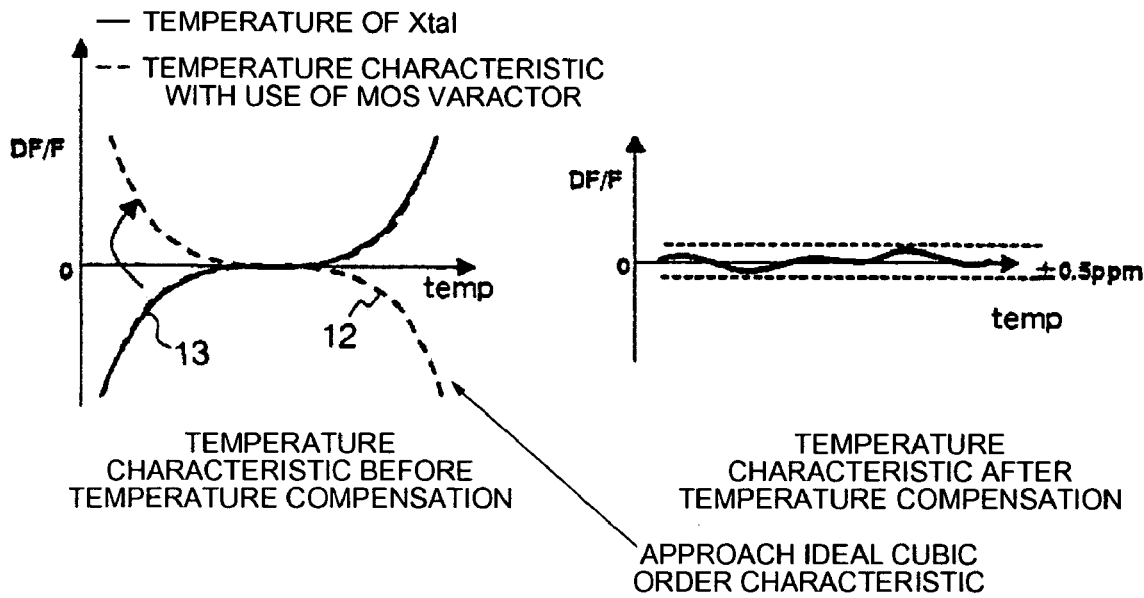
FIGS. 3A to 3C are graphs illustrating the temperature characteristic of a temperature-compensated voltage generation circuit 100 in FIG. 2.
Figure 3C:
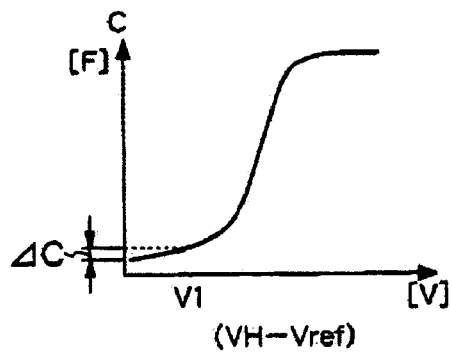

FIGS. 3A to 3C are graphs describing the temperature characteristic of a temperature-compensated crystal oscillator shown in FIG. 16, provided with the temperature-compensated voltage generation circuit 110 shown in FIG. 1, as a source of the VH and VL. A solid line 13 in FIG. 3A indicates the frequency-temperature characteristic of the crystal resonator X, and the dotted line 12 indicates the characteristic of frequency-control by the temperature-compensated voltage generation circuit 110. Upon strictly performing the temperature compensation to the curvature part in the frequency-temperature characteristic of the crystal resonator X, a frequency control quantity based on the MOS varactor capacitance together with the first-degree voltage characteristic is not enough, while in the temperature-compensated voltage generation circuit 110, the shortage may be compensated by controlling the variable quantity of the compensation voltage with utilization of the aforementioned high-degree voltage. As a result, as shown in FIG. 3A, the frequency control characteristic 12 whose quantity is enough to balance out the frequency-temperature characteristic 13 of the crystal resonator X may be obtained. According to the results of a simulation, the precision of the temperature characteristic after the temperature compensation is within the range of ±0.5 ppm inclusive. Hence the TCXO with a high frequency stability is obtained.

In the case of the frequency-temperature compensated circuit shown in FIG. 1, the high-temperature section control voltage signal VH and the low-temperature section control voltage signal VL variate in the entire temperature range, as shown in FIGS. 2B and 2F. Therefore, in the temperature range below or at 25 degrees centigrade, for instance, a slight effect caused by the deviation of the voltage of the high-temperature section control voltage VH occurs, since a variable capacitance characteristic of the high-temperature compensation MOS varactor MH has a slight sensitivity characteristic over voltage deviation. However, if the low-temperature high-degree voltage gain regulating circuit is set, while taking into consideration the frequency deviation caused by the change of the high-temperature section control voltage VH, then the compensation may be performed with the frequency control of the low-temperature section control voltage VL, for the frequency-temperature characteristic that is affected, not by the crystal resonator X, but by other effects.

In the case where the temperature range that requires the frequency control by the high-temperature section control voltage VH to be at or above common temperature, and where the value of the high-temperature section control voltage VH in the common temperature is expressed by $V1'=V1+Vref$, as shown in FIG. 2B, if the voltage-capacitance characteristic of the high-temperature compensation MOS varactor MH shown in FIG. 3C is in the ideal state (constant when voltage is at or below V1), the capacitance of the MOS varactor MH does not change in a voltage range of at or below V1 (temperature range where the voltage is at or below 1V), even if the high-temperature section control voltage VH changes in the temperature range at or below common temperature. Therefore, theoretically, there is no effect caused by the change of the high-temperature section control voltage VH in a low temperature. However, in the voltage-capacitance characteristic of an actual MOS varactor, a capacitance deviation characteristic ($\Delta c$ shown in FIG. 3C) exists slightly in the vicinity of the voltage V1. Hence the change of frequency, caused by the voltage change of the high-temperature section control voltage VH in the low temperature, occurs slightly.

The highly stable frequency-temperature characteristic of the TCXO is achieved by: setting the low-temperature high-degree voltage gain regulating circuit, for the low temperature environment, to compensate not only the frequency-temperature characteristic of the crystal resonator X, but also the frequency deviation caused by the change of the high-temperature section control voltage VH; and by setting the high-temperature high-degree voltage gain regulating circuit, for the high temperature environment, to also compensate the frequency deviation caused by the change of the low-temperature section control voltage VL.

FIG. 4A is a block diagram of the function of the frequency-temperature compensated circuit in accordance with another embodiment of the invention, and FIGS. 4k and 4m are graphs expressing the relationship between the temperature (temp) and the control voltage (V), as in the output characteristics of the composite circuits 6 and 7 in the temperature-compensated voltage generation circuit 100 shown in FIG. 4A. FIGS. 4B and 4F indicate the output characteristic of the composite circuits 6 and 7 shown in FIGS. 2B and 2F, and FIG. 4K indicates the characteristic of the control voltage which is clipped by a high-temperature clipping voltage 8 and a diode 10, in the temperature range of around the common temperature or lower. FIG. 4m is a graph that indicates the characteristic of the control voltage which is clipped by a low-temperature clipping voltage 9 and a diode 11, in the temperature range of around the common temperature or higher.

FIG. 4A is a block diagram of a modified function of a temperature-compensated voltage generation circuit that generates the compensation voltage supplied to the temperature-compensated piezoelectric oscillator that is in accordance with a second embodiment of the invention. This temperature-compensated voltage generation circuit 100 includes: a temperature sensor (temperature detection unit) 1, where the parameter thereof changes with the surrounding temperature; a high-temperature first-degree voltage gain regulating circuit (high-temperature first-degree voltage generation circuit) 2 which generates a voltage that changes linearly with temperature; a high-temperature high-degree voltage gain regulating circuit (high-temperature high-degree voltage generation circuit) 3 that generates a voltage that behaves like a high degree function in a high temperature state of the voltage generated by the high-temperature first-degree voltage gain regulating circuit 2; the high-temperature first-degree voltage gain regulating circuit (high-temperature voltage composite circuit) 6; a high-temperature clipping voltage (generation circuit) 8 that clips the output from the composite circuit 6 at a prescribed level; a diode 10; a low-temperature first-degree voltage gain regulating circuit (low-temperature first-degree voltage generation circuit) 4 that generates a voltage that changes linearly with temperature; a low-temperature high-degree voltage gain regulating circuit (low-temperature high-degree voltage generation circuit) 5 that generates a voltage that behaves like a high degree equation in a low temperature state of the voltage generated by low-temperature first-degree voltage gain regulating circuit 4; a composite circuit (low-temperature voltage composite circuit) 7 that synthesizes the voltages output from the low-temperature first-degree voltage gain regulating circuit 4 and low-temperature high-degree voltage gain regulating circuit 5; low-temperature clipping voltage (composite circuit) 9 that clips the output from the composite circuit 7 at a prescribed level; and a diode 11.

The operation of the temperature-compensated voltage generation circuit 100 shown in FIG. 4A will now be described.

The high-temperature first-degree voltage gain regulating circuit 2 in the temperature-compensated voltage generation circuit 100 shown in FIG. 4A outputs the linear function voltage shown in FIG. 2D, after receiving temperature information of the temperature sensor 1. The high-temperature high-degree voltage gain regulating circuit 3 outputs a high-temperature high dimensional function voltage shown in FIG. 2C, after receiving the temperature information of the temperature circuit 1.

Thereafter, the composite circuit 6 synthesizes the output voltage of the high-temperature first-degree voltage gain regulating circuit 2 with the output voltage of the high-temperature high-degree voltage gain regulating circuit 3, and outputs an output voltage VH' shown in FIG. 4B.

Here, the behavior of the output voltage VH' with temperature transition is as follows: in the common temperature, the voltage value thereof is V1'; below the common temperature, the voltage value declines linearly as the temperature declines; and above the common temperature, it increases like an exponential function as the temperature increases.

By setting the output voltage value of the high-temperature clipping voltage (generation circuit) 8 to V1', in the condition where the output voltage value of the composite circuit 6 is lower than V1' (lower than the common temperature), the output value V1' of the high-temperature clipping voltage (generation circuit) 8 becomes the control voltage signal VH for the high temperature side, since forward-bias is applied between the terminals of the diode 10.

Consequently, the behavior of the high-temperature section control voltage signal VH with temperature transition is, as shown in FIG. 4k, as follows: below or at the common temperature, the voltage value is V1; above or at the common temperature, the voltage increases linearly up to the desired temperature; and from the desired temperature and above, the voltage increases like a exponential function.

The low-temperature first-degree voltage gain regulating circuit 4 in the temperature-compensated voltage generation circuit 100 shown in FIG. 4A outputs the linear function voltage shown in FIG. 2H, after receiving temperature information of the temperature sensor 1. The low-temperature high-degree voltage gain regulating circuit 5 outputs a low-temperature high dimensional function voltage shown in FIG. 2G, after receiving the temperature information of the temperature circuit 1.

Thereafter, the composite circuit 7 synthesizes the output voltage of the low-temperature first-degree voltage gain regulating circuit 4 with the output voltage of the low-temperature high-degree voltage gain regulating circuit 5, and outputs an output voltage VL' shown in FIG. 4f.

Here, the behavior of the output voltage VL' with temperature transition is as follows: in the common temperature, the voltage value thereof is V2'; above the common temperature, the voltage value declines linearly as the temperature increases; and below the common temperature, it increases like an exponential function as the temperature decreases.

By setting the output voltage value of the low-temperature clipping voltage (generation circuit) 9 to V2', in the condition where the output voltage value of the composite circuit 7 is higher than V2' (higher than the common temperature), the output value V2' of the low-temperature clipping voltage (generation circuit) 9 becomes the control voltage signal VL for the high temperature side, since forward-bias is applied between the terminals of the diode 11.

Consequently, the behavior of the low-temperature section control voltage signal VL with temperature transition is, as shown in FIG. 4m, as follows: above or at the common temperature, the voltage value is V2'; below or at the common temperature, the voltage increases linearly up to the desired temperature; and from the desired temperature and below, it increases like an exponential function.

As described, the temperature compensation by the MOS varactor MH is not necessary in, for instance, the low temperature state. Therefore, the inter-terminal voltage V1 of the MOS varactor MH (expressed with V1=VH−Vref) is set so that the voltage-capacitance characteristic of the MOS varactor becomes stable, as shown in FIG. 4B. However, even though this voltage-capacitance characteristic is stable, in actuality, there is a slight voltage sensitivity.

Hence, in the embodiment shown in FIG. 1, the compensation is performed using the temperature compensation feature for the low-temperature side and for the frequency deviation caused by the undesirable voltage sensitivity characteristic of the MOS varactor MH. In contract, in the embodiment shown in FIG. 4A, by setting the high-temperature section control voltage signal VH to a constant value below or at the common temperature, the effect of the high-temperature section control voltage in the low temperature may be reduced. Consequently, the voltage regulating process, etc, may be simplified, for the temperature controls in the low temperature state or in the high temperature state.

Figure 5A:
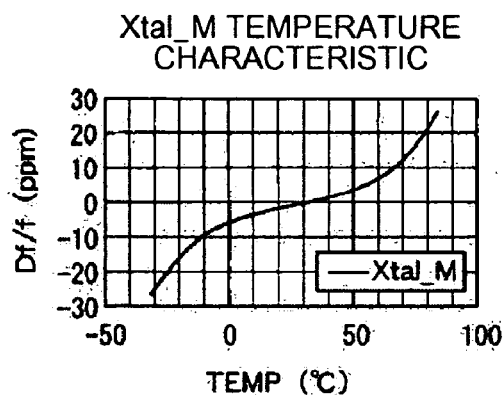
FIGS. 5A to 5D are graphs expressing the results of a computer-simulated calculation of the compensation characteristics in the temperature-compensated voltage generation circuit 100, according to the first embodiment of the invention.
Figure 5B:
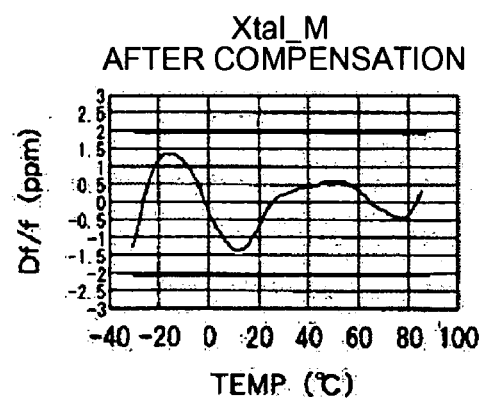
Figure 5C:
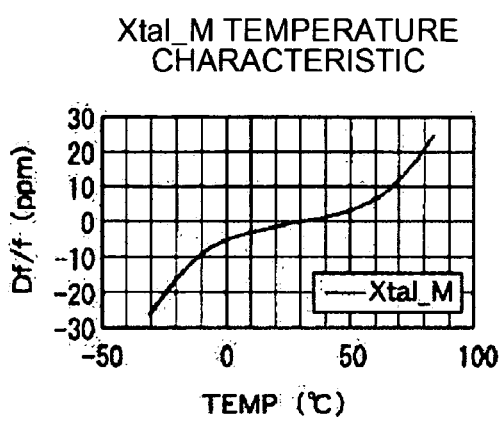
Figure 5D:
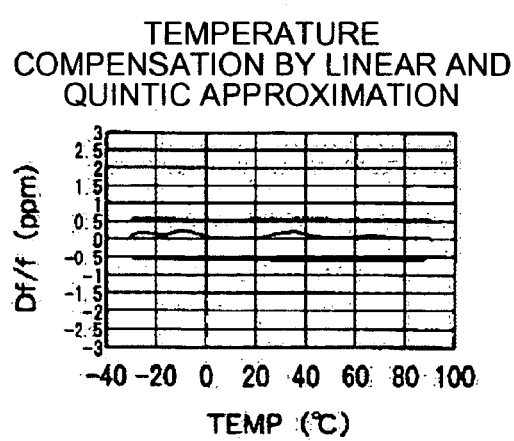

FIG. 5D indicates the results of a computer-simulation of the compensation characteristics in the temperature-compensated voltage generation circuit 100 shown in FIG. 4A, and FIG. 5B indicates the results of a computer-simulation of the frequency-temperature characteristic of the TCXO provided with a common temperature-compensated circuit. As clearly indicated from these graphs, the frequency deviates between ±2 ppm in the range of −30 to +85 degrees centigrade in the common temperature-compensated circuit shown in FIG. 5B, while according to the embodiments of the invention, a high frequency stability is obtained, where the frequency deviation is between ±0.5 ppm in the same aforementioned temperature range, as shown in FIG. 5D.

Here, FIGS. 5A and 5C are the frequency-temperature characteristic of the crystal resonator X before temperature compensation.

Figure 6:
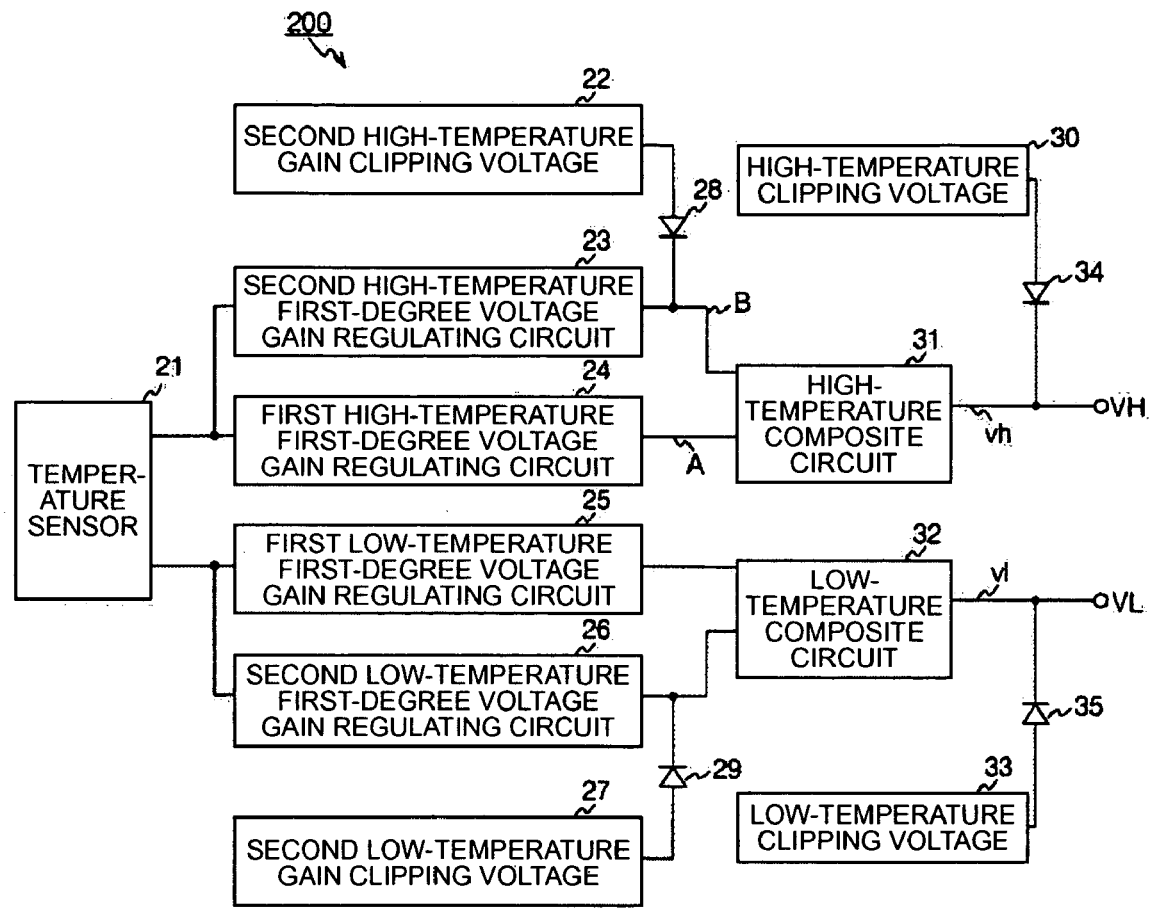
FIG. 6 is a block diagram of a function of the temperature-compensated voltage generation circuit that constitutes part of the temperature-compensated piezoelectric oscillator, according to a second embodiment of the invention.
Figure 7E:
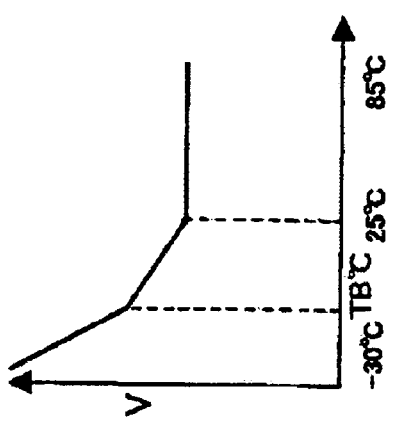
FIGS. 7A to 7E are graphs illustrating the waveforms of voltages A, B, vh, and VH, in the block diagram of function in FIG. 6.
Figure 7D:
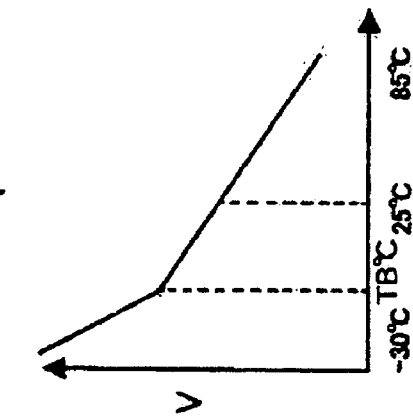
Figure 7C:
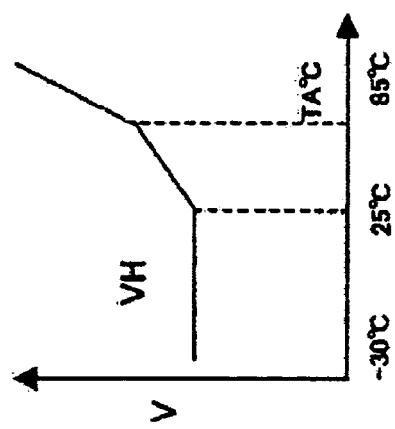
Figure 7B:
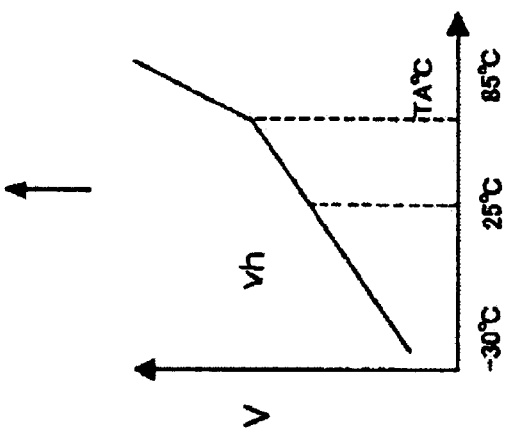
Figure 7A:
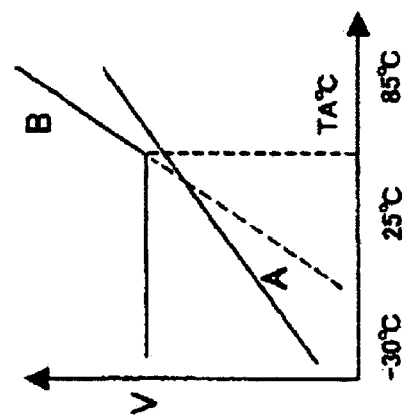
Figure 8:
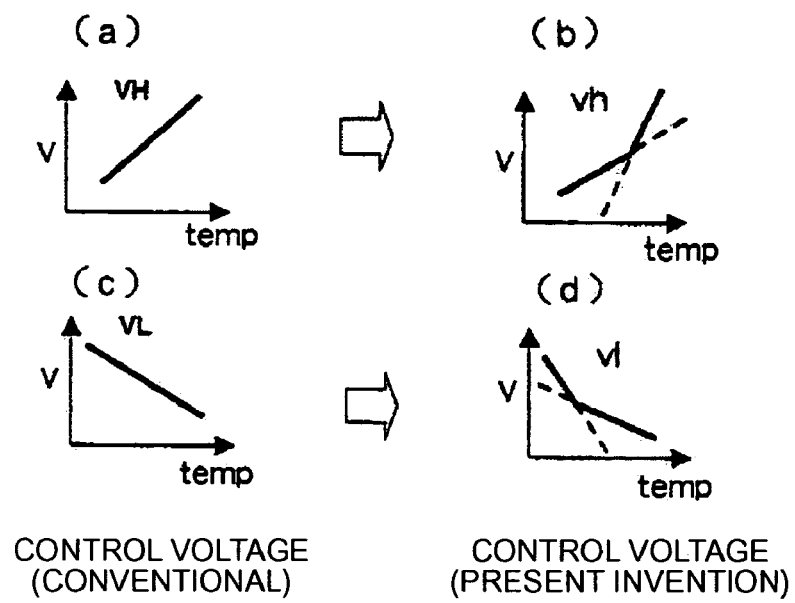
FIGS. 8(a) to 8(d) are graphs illustrating the temperature characteristic of a temperature-compensated voltage generation circuit 200 in FIG. 6.

FIG. 6 is a block diagram of a function of a temperature-compensated voltage generation circuit that constitutes part of a temperature-compensated piezoelectric oscillator, according to a third embodiment of the present invention. The temperature-compensated voltage generation circuit 200 includes: the temperature sensor (temperature detection unit) 21 that outputs electric signals that correspond to the change of the surrounding temperature; a first high-temperature first-degree voltage gain regulating circuit (first high-temperature first-degree voltage generation circuit) 24 that generates a voltage that changes linearly based on the temperature detecting information of the temperature sensor 21, so that the voltage is proportional to the temperature; a second high-temperature first-degree voltage gain regulating circuit (second high-temperature first-degree voltage generation circuit) 23 that generates a voltage that changes linearly in proportion to the temperature increase, based on the temperature detecting information of the temperature sensor 21; a second high-temperature voltage gain clipping voltage (second high-temperature first-degree voltage generation circuit) 22 that clips the voltage that is at the temperate below or at the prescribed temperature of the second high-temperature first-degree voltage gain regulating circuit 23, via a diode 28; a high-temperature composite circuit (high-temperature voltage composite circuit) 31 that synthesizes the output voltage of the first high-temperature first-degree voltage gain regulating circuit 24 with the output voltage of the second high-temperature first-degree voltage gain regulating circuit 23 controlled by the second high-temperature first-degree voltage generation circuit 22; a high-temperature clipping voltage generation unit 30 that clips, at the prescribed level, the output that is at the temperature below or at the prescribed temperature of the high-temperature composite circuit 31, via a diode 34; a first low-temperature first-degree voltage gain regulating circuit (first low-temperature first-degree voltage generation circuit) 25 that generates a voltage that changes linearly so that it is inversely proportional to the temperature increase; a second low-temperature first-degree voltage gain regulating circuit (second low-temperature first-degree voltage generation circuit) 26 which generates a voltage that changes linearly so that it is inversely proportional to the temperature increase; a second low-temperature voltage gain clipping voltage (second low-temperature first-degree voltage generation circuit) 27 that clips the voltage that is at the temperate above or at the prescribed temperature of the second low-temperature first-degree voltage gain regulating circuit 26, via a diode 29; a low-temperature composite circuit (low-temperature voltage composite circuit) 32 that synthesizes the output voltage of the first low-temperature first-degree voltage gain regulating circuit 25 with the output voltage of the second low-temperature first-degree voltage gain regulating circuit 26 controlled by the second low-temperature first-degree voltage generation circuit 27; and a low-temperature clipping voltage unit 33 that clips the output of the low-temperature composite circuit 32 to a prescribed level, via a diode 35.

FIG. 7 are graphs indicating the waveforms of the voltage characteristic with temperature of the following: an output voltage A of the first high-temperature first-degree voltage gain regulating circuit 24 of the block diagram of FIG. 6; an output voltage B of the second high-temperature first-degree voltage gain regulating circuit 23 controlled by the second high-temperature first-degree voltage generation circuit 22; an output voltage vh of the high-temperature composite circuit 31; and the output voltage VH of the high-temperature composite circuit 31 controlled by the high-temperature clipping voltage generation unit 30. The voltage A in FIG. 7A is a voltage that increases linearly, in proportion to temperature increase, as described above. The output voltage B indicates the behavior of a voltage. Here, the output voltage that behaves like a linear function with temperature increase, for the entire temperature range used in the second high-temperature first-degree voltage gain regulating circuit 23, is clipped to the output voltage value of the second high-temperature first-degree voltage generation circuit 22, by the second high-temperature voltage gain clipping voltage and the diode 28, in the range below or at TA degrees centigrade (TA>25). The output voltage vh shown in FIG. 7B indicates a behavior of the synthesized output voltages of A and B shown in FIG. 7A. Specifically, up to TA degrees centigrade, the voltage behavior is that of the sum of the linear function behavior of the output voltage A, and the linear function behavior of the voltage B, and below or at TA degrees centigrade, the voltage behavior is that of the sum of the linear function behavior of the output voltage A, and constant function behavior of the voltage B. The voltage VH shown in FIG. 7C is a voltage in which the voltage vh is clipped to the output voltage value of the high-temperature clipping voltage generation unit 30, in the temperature range of below or at 25 degrees centigrade. The low temperature indicates the temperature range that is below or at the temperature point TB that is lower than the clipping-controlled 25 degrees centigrade controlled by the second low-temperature first-degree voltage generation circuit 27. The voltage V1 shown in FIG. 7D behaves like the one shown in FIG. 7E; hence the description thereof is omitted.

Figures 9A, 9B:
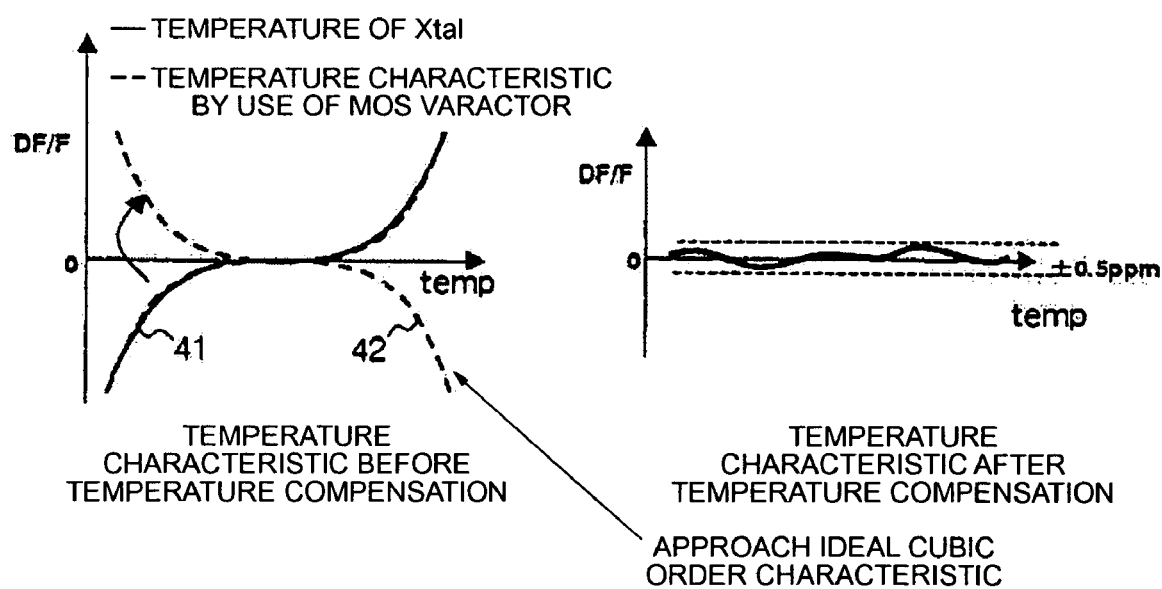
FIGS. 9A and 9B includes graph expressing the results of a computer-simulated calculation of the compensation property in the temperature-compensated voltage generation circuit 200, according to the second embodiment of the invention.
Figure 10:
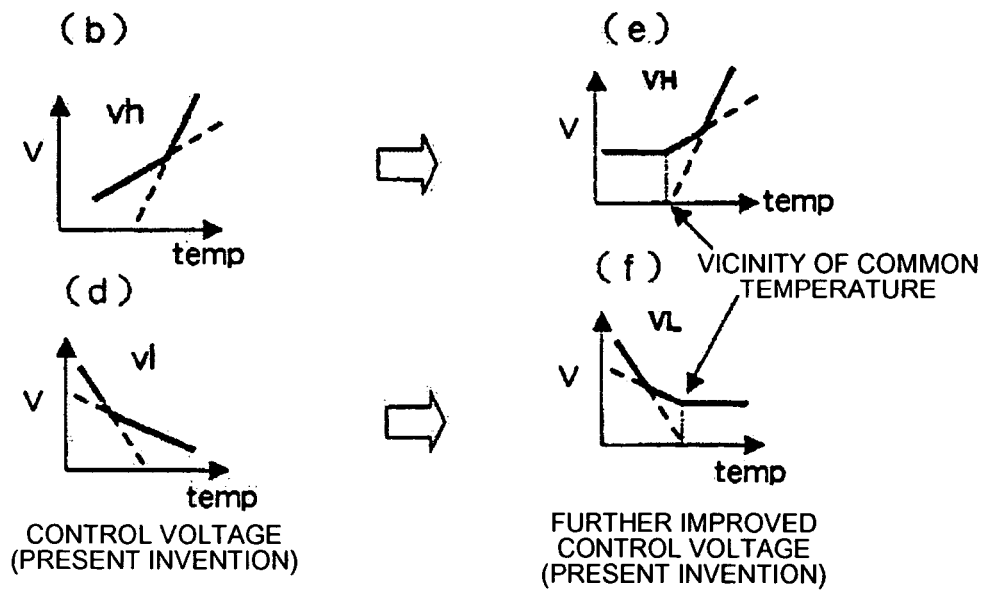
FIGS. 10(b), 10(e), 10(d), and 10(f) are graphs expressing the relationship between the temperature (temp) and the control voltage (V), where the outputs from composite circuits 31 and 32 in FIG. 6 are improved.

FIG. 9A illustrating the frequency-temperature characteristic of the TCXO provided with the temperature-compensated voltage generation circuit 200 shown in FIG. 6. A solid line 41 indicates the frequency-temperature characteristic of the crystal resonator X, and a dotted line 42 indicates the frequency variable behavior with the use of the temperature-compensated voltage generation circuit 200 and the MOS varactor. As clearly illustrated in these graphs, in the temperature-compensated voltage generation circuit 200, the output voltage behavior may be adjusted by dividing the temperature range into several ranges; hence the frequency variable characteristic for compensating the frequency-temperature characteristic of the crystal resonator X, indicated in the dotted line 42, maybe efficiently regulated. As a result, the precision of the temperature characteristic after the temperature compensation may be stabilized to be within the range of ±0.5 ppm inclusive.

Figures 16A, 16B:
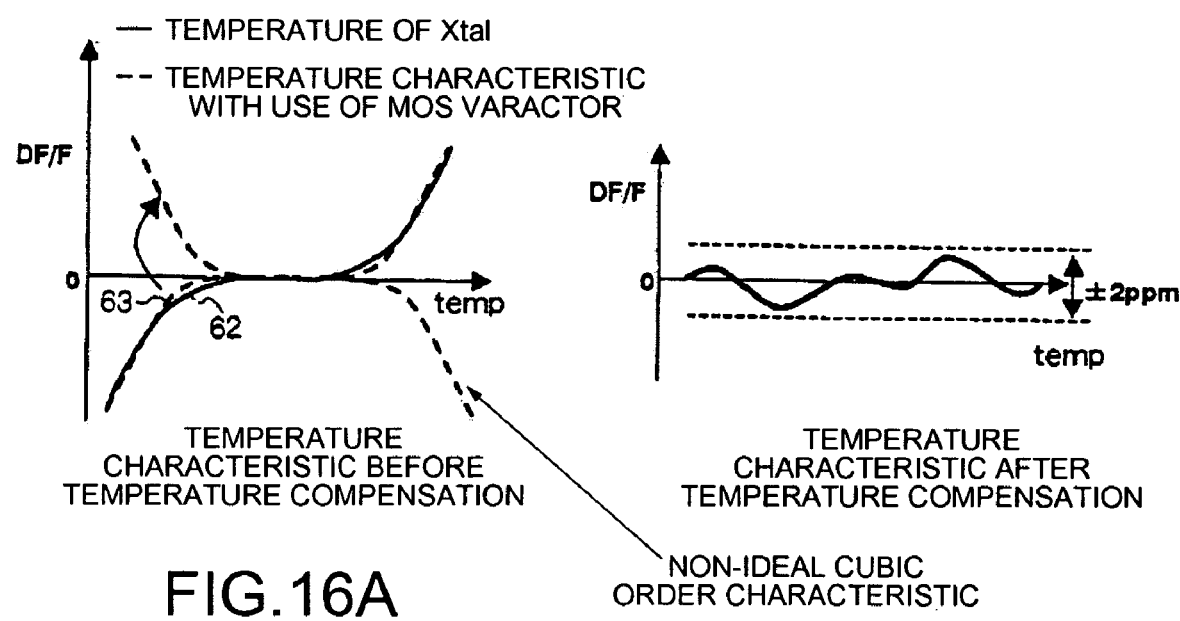
FIG. 16A and 16B include graphs expressing the temperature characteristic of the temperature-compensated piezoelectric oscillator in FIG. 15.

FIG. 9B illustrates the result of a computer-simulation of the compensation characteristics of the TCXO which is provided with the temperature-compensated voltage generation circuit 200 that is in accordance with the second embodiment of the invention. FIG. 16B illustrates the result of a computer-simulation of the frequency-temperature characteristic of the TCXO in which the frequency-temperature compensation is performed with a common temperature-compensated voltage. As clearly illustrated in these graphs, the result of the temperature compensation in FIG. 16B deviates within the range of ±2 ppm inclusive, while in the embodiment according to the invention, the frequency deviation is within the range of ±0.5 ppm inclusive, as shown in FIG. 9B. This means that the temperature compensation is improved.

Figure 11:
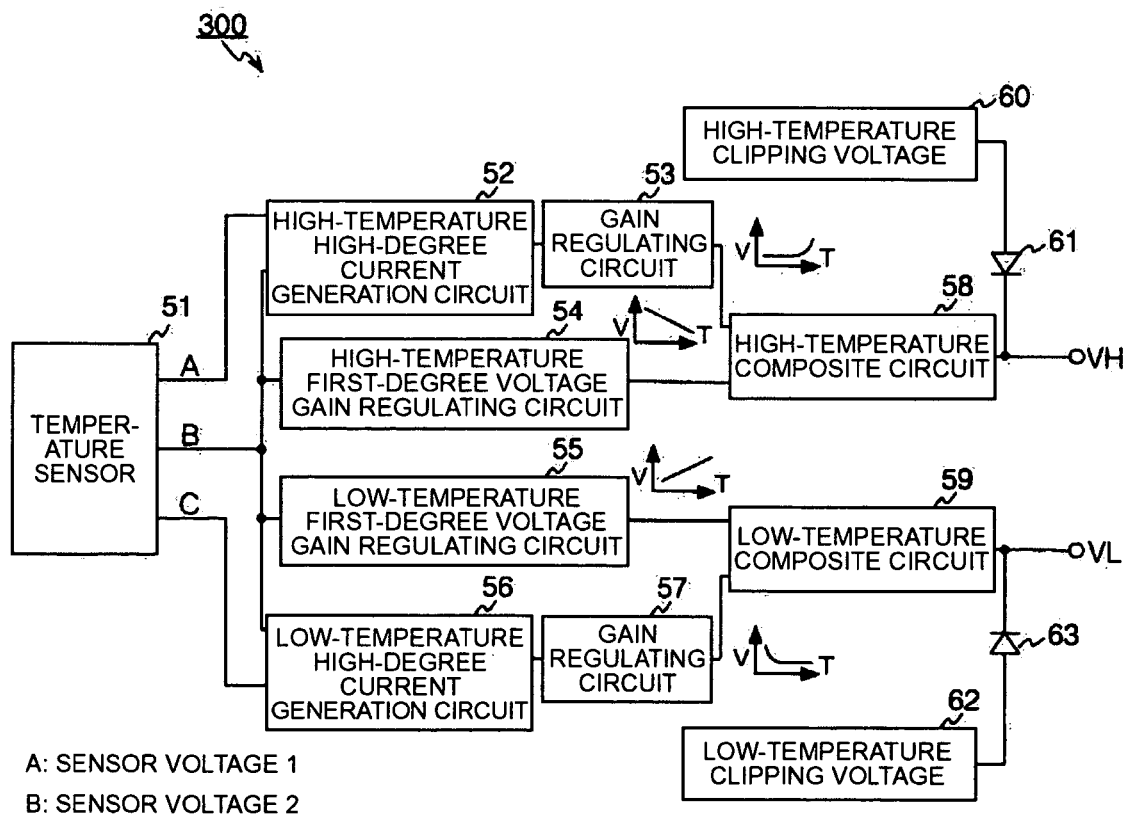
FIG. 11 is a block diagram of a function of the temperature-compensated voltage generation circuit that constitutes part of the temperature-compensated piezoelectric oscillator, according to a third embodiment of the invention.

FIG. 11 is a block diagram of a function of a temperature-compensated voltage generation circuit for generating the control voltage that is supplied to a temperature-compensated piezoelectric oscillator, in accordance with a forth embodiment of the present invention. A temperature-compensated voltage generation circuit 300 includes: a temperature sensor (temperature detection unit) 51 that generates first through third sensor voltages (A, B, and C) with the parameter change caused by the surrounding temperature; a high-temperature first-degree voltage gain regulating circuit (high-temperature first-degree voltage generation circuit) 54 which generates a voltage that changes linearly, based on the second sensor voltage B, so that the voltage is proportional to the temperature increase; a high-temperature high-degree current generation circuit (high-temperature high-degree current generation circuit) 52 that outputs a current that behaves like a high-degree function with temperature increase for the high-temperature side (behavior is like a exponential function), having the first sensor voltage A and the second sensor voltage B as input voltages; a gain regulating circuit (high-temperature high-degree voltage generation circuit) 53 that converts the output current to a voltage; a high-temperature composite circuit (high-temperature voltage composite circuit) 58 that synthesize the output voltages of the high-temperature first-degree voltage gain regulating circuit 54 and the gain regulating circuit 53; a high-temperature clipping voltage generation circuit 60 that clips the output voltage of the high-temperature composite circuit 58 at a prescribed level, via a diode 61; a low-temperature first-degree voltage gain regulating circuit (low-temperature first-degree voltage generation circuit) 55 that generates a voltage that changes linearly, so that it is inversely proportional to the temperature increase, based on the second sensor voltage B; a low-temperature high-degree current generation circuit (low-temperature high-degree current generation circuit) 56 that outputs a current that behaves like a high-degree function with temperature decrease for the low-temperature side (behavior is like a exponential function), having the third sensor voltage C and the second sensor voltage B as input voltages; a gain regulating circuit (low-temperature high-degree voltage generation circuit) 57 that converts the output current to a voltage; a low-temperature composite circuit (low-temperature voltage composite circuit) 59, which synthesizes the output voltage of the first low-temperature first-degree voltage-gain regulating circuit 55 with the output voltage of the gain regulating circuit 57; and a low-temperature clipping voltage 62 that clips the output voltage of the low-temperature composite circuit 59 to a prescribed level, via a diode 63.

Figures 12A, 12B:
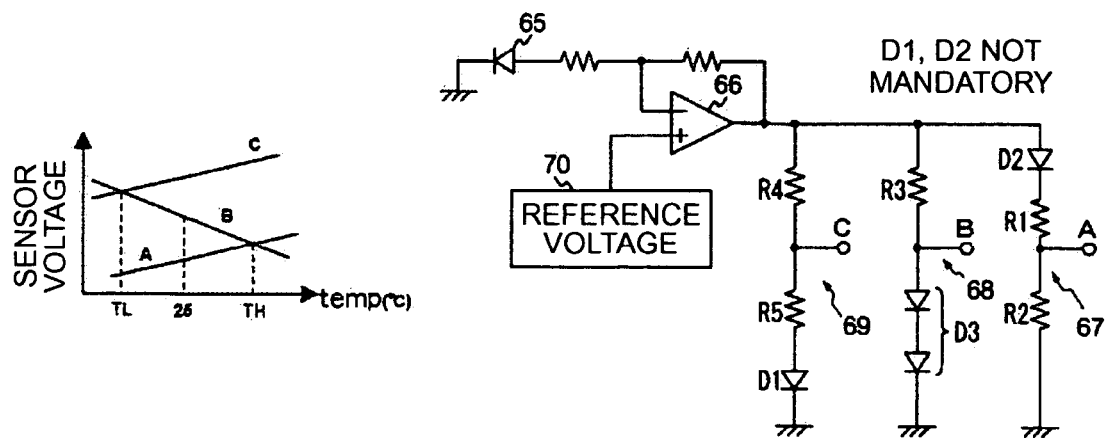
FIG. 12A is a graph that illustrates an example of a sensor output voltage of a temperature sensor 51.
FIG. 12B is a drawing that illustrates an example of a circuit that generates sensor voltages.

FIG. 12A is a graph that illustrates the example of the sensor voltages A, B, and C of the temperature sensor 51, and FIG. 12B is a circuit diagram that illustrates an example of the temperature sensor (temperature detection unit) 51 that generates the sensor voltages.

The configuration of the temperature sensor 51 is as follows: the anode terminal of the diode component of a sensor 65 is connected to an inverted input terminal of an op-amp (amplifier) 66, via a resistor; the cathode terminal of this diode is grounded; an output terminal of a reference voltage generation circuit 70 is connected to a non-inverted input terminal of the amplifier 66; the output terminal of the amplifier 66 is connected to the inverted input terminal via a feedback resistor; an anode terminal of a diode D2 is connected to the output terminal of the amplifier 66; a cathode terminal of the diode D2 is grounded via a series circuit composed with a resistors R1 and R2; a connecting point of the resistor R1 and the resistor R2 is set to an output terminal A of the first sensor voltage A; one end of the resistor R3 is connected to the output terminal of the amplifier 66, and between the other end of the resistor R3 and the ground, two diodes D3 are connected in series in a forward direction; a connecting point of the diode D3 and the resistor R3 is set to an output terminal B of the second sensor voltage B; one end of a resistor R4 is connected to the output terminal of the amplifier 66, and the other end of the resistor R4 is connected to one end of a resistor R5; and between the other end of the resistor R5 and the ground, a diode D1 is connected in series in a forward direction, and a connection point of the resistors R4 and R5 is set to an output terminal C of the third sensor voltage C.

An operation of the temperature sensor 51 will now be described.

Since the sensor 65 shown in FIG. 12 is a diode component, the current that flows in the sensor 65 behaves like a linear function that declines with temperature increase, being inversely proportional to the temperature increase. Hence the voltage that declines linearly, being inversely proportional to the temperature increase (at least, within the used temperature range, the modulus of the voltage applied to the inverted terminal is smaller than the reference voltage value) is applied to the inverted input terminal of the amplifier 66. Consequently, the output voltage that increases linearly with a behavior like a linear function, being proportional to the temperature increase, is generated in the output terminal of the amplifier.

Moreover, in the terminal A, a voltage is generated based on a potential ratio between the resistor R2 and the series circuit of the diode D2 and the resistor R1, and in the terminal B, another voltage is generated based on a potential ratio between the resistor R3 and the diode D3. Further, in the terminal C, a voltage is generated based on a potential ratio between the resistor R4 and the series circuit of the resistor R5 and the diode D1.

Here, the diodes D1 and D2 are provided, in order to change the resistor ratio between the resistor R2 and series circuit of the diode D2 and the resistor R1, with, for instance, temperature transition, and thereby regulating the deviation behavior (regulation) of the output voltage of the amplifier (sensor voltage A) in a fine manner, by utilizing the temperature characteristic unique to the diode component, where the inter-terminal current declines with temperature increase (impedance between the terminals of the diodes D1 and D2 increases). However, if the regulation is possible only with resistor's configuration, the diodes D1 and D2 are not necessary.

The plurality of diode, for instance, is connected in series, constituting the diode D3, so that the potential of the terminal B declines rapidly with temperature increase. Therefore, by configuring the number of diodes properly, the sensor voltage B (shown in FIG. 12A) that has a negative gradient of voltage change rate with temperature increase may be obtained from the output terminal B.

If the resistors R1 through R5, the diodes D1 through D3, and other circuit component are properly configured, the sensor voltages A, B, and C may be obtained, where the values of the sensor voltages B and C match at temperature TL (below 25 degrees centigrade), and where the values of the sensor voltages A and B match at temperature TH (above 25 degrees centigrade) as shown in FIG. 12A.

Figure 13:
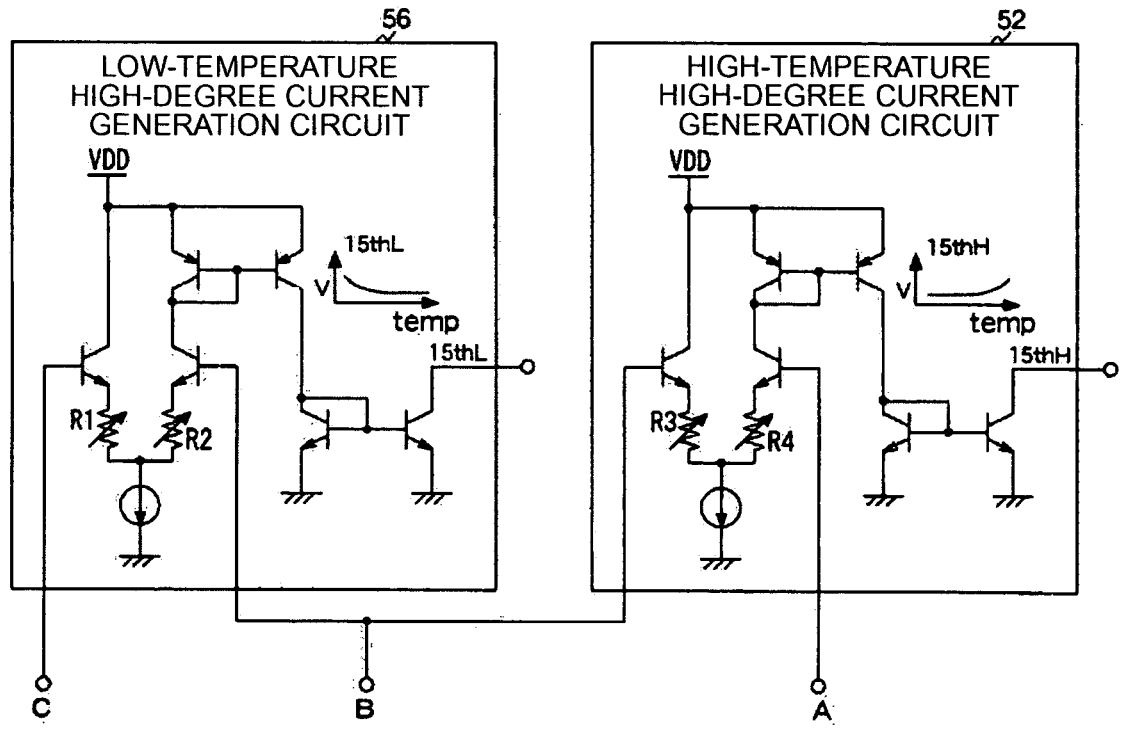
FIG. 13 is a drawing that describes an operation of a high-temperature high-degree current generation circuit 52 and a low-temperature high-degree current generation circuit 56 in FIG. 11.

FIG. 13 is a drawing of the high-temperature high-degree current generation circuit 52 and the low-temperature high-degree current generation circuit 56 in FIG. 11. The description will follow while also referring to FIG. 12A. The high-temperature high-degree current generation circuit 52 utilizes the sensor voltages A and B in the high-temperature side. In a temperature lower than the common temperature, the sensor voltage B is much higher than the sensor voltage A; hence the current does not flow in the resistor R4 side, and the output current 15thH is zero. As the temperature increases, the potential difference between the sensors A and B diminish, and the current starts to flow in the resistor R4 side; hence the output current 15thH of the high-temperature high-degree current generation circuit 52 is generated. The current generated at this point may be approximated to a high-degree function, having the common temperature as a center. Moreover, the regulation is conducted so that the temperature TH, where the voltages of the sensor A and B match, is on the high-temperature side. The behavior of the low-temperature side is similar to that of the high-temperature, and the regulation is conducted so that the cross point of the sensors B and C is at the low-temperature side within the temperature compensated range. The current behavior over temperature changes by changing the resistance values of the resistor R1 through R4, so that, virtually, the degree of a function changes; thus the degree in a high-degree function may be regulated with this change of resistance. Consequently, the characteristic of the MOS varactor may be regulated, in a fine manner, to that of crystal resonators.

Figure 14:
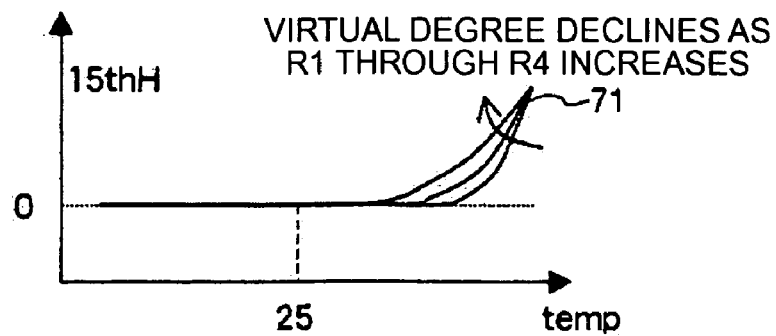
FIG. 14 is a graph illustrating an example of property of a high-temperature high-degree current, after a degree adjustment.

FIG. 14 is a graph illustrating an example of property of a high-temperature high-degree current, after a degree adjustment. As shown in the figure, a current behavior 71 over temperature changes by changing the resistance values of the resistor R1 through R4, so that, virtually, the degree of a function changes. In this figure, the degree virtually declines as the current behavior 71 shifts to the direction of the arrow.

The invention claimed is:

1. A temperature compensated piezoelectric oscillator comprising:
   an oscillation circuit that drives a piezoelectric element with a current;
   a direct-current-stopping fixed capacitor;
   a frequency-temperature compensated circuit that compensates the deviation of an oscillation frequency caused by a change of temperature; and
   a piezoelectric transducer which includes a piezoelectric element driven in a prescribed frequency, where the above elements are connected serially;
   wherein the frequency-temperature compensated circuit includes a temperature compensation voltage generation section which generates a voltage based on a parameter that is changed in a temperature detection unit, in which the parameter changes according to the surrounding temperature;
   wherein the temperature compensation voltage generation section includes:
      a low-temperature control voltage generation section which generates a voltage that compensates a temperature characteristic of the piezoelectric element in a low temperature, where "low" indicates temperatures lower than a common temperature in the temperature characteristic of the piezoelectric element; and
      a high-temperature control voltage generation section which generates a voltage that compensates the temperature characteristic of the piezoelectric element in a high temperature, where "high" indicates temperatures higher than a common temperature in the temperature characteristic of the piezoelectric element;
   wherein the low-temperature control voltage generation section includes:
      a low-temperature first-degree voltage generation circuit which generates the voltage that linearly changes with temperature;
      a low-temperature high-degree voltage generation circuit which generates the voltage that behaves like a high degree function in a low temperature state of the voltage generated by the low-temperature first-degree voltage generation circuit; and
      a low-temperature voltage composite circuit which synthesizes voltages generated by the low-temperature first-degree voltage generation circuit and the low-temperature high-degree voltage generation circuit; and
   wherein the high-temperature control voltage generation section includes:
      a high-temperature first-degree voltage generation circuit which generates the voltage that linearly changes with temperature;
      a high-temperature high-degree voltage generation circuit which generates the voltage that behaves like a high degree function in a high temperature state of the voltage generated by the high-temperature first-degree voltage generation circuit; and
      a high-temperature voltage composite circuit which synthesizes voltages generated by the high-temperature first-degree voltage generation circuit and the high-temperature high-degree voltage generation circuit.

2. A temperature compensated piezoelectric oscillator comprising:
   an oscillation circuit that drives a piezoelectric element with a current;
   a direct-current-stopping fixed capacitor;
   a frequency-temperature compensated circuit that compensates the deviation of an oscillation frequency caused by a change of temperature; and
   a piezoelectric transducer which includes a piezoelectric element driven in a prescribed frequency, where the above elements are connected serially;
   wherein the frequency-temperature compensated circuit includes a temperature compensation voltage generation section which generates a voltage based on a parameter that is changed in a temperature detection unit, in which the parameter changes according to the surrounding temperature;
   wherein the temperature compensation voltage generation section includes:
      a low-temperature control voltage generation section which generates a voltage that compensates a temperature characteristic of the piezoelectric element in a low temperature, where "low" indicates temperatures lower than a common temperature in the temperature characteristic of the piezoelectric element; and
      a high-temperature control voltage generation section which generates a voltage that compensates the temperature characteristic of the piezoelectric element in a high temperature, where "high" indicates temperatures higher than a common temperature in the temperature characteristic of the piezoelectric element;
   wherein the low-temperature control voltage generation section includes:
      a first low-temperature first-degree voltage generation circuit which generates a voltage that linearly changes in a first gradient with temperature;
      a second low-temperature first-degree voltage generation circuit which generates a voltage that linearly changes in a second gradient with temperature; and
      a low-temperature voltage composite circuit which synthesizes voltages generated by the first low-temperature first-degree voltage generation circuit and the second low-temperature first-degree voltage generation circuit;
   wherein the high-temperature control voltage generation section includes:
      a first high-temperature first-degree voltage generation circuit which generates the voltage that linearly changes with temperature in a first gradient;
      a second high-temperature first-degree voltage generation circuit which generates the voltage that linearly changes with temperature in a second gradient; and a high-temperature voltage composite circuit which synthesizes voltages generated by the first high-temperature first-degree voltage generation circuit and the second high-temperature first-degree voltage generation circuit.

3. A temperature compensated piezoelectric oscillator comprising:
an oscillation circuit that drives a piezoelectric element with a current;
a direct-current-stopping fixed capacitor;
a frequency-temperature compensated circuit that compensates the deviation of an oscillation frequency caused by a change of temperature; and
a piezoelectric transducer which includes a piezoelectric element driven in a prescribed frequency, where the above elements are connected serially;
wherein the frequency-temperature compensated circuit includes a temperature compensation voltage generation section which generates a voltage based on a parameter that is changed in a temperature detection unit, in which the parameter changes according to the surrounding temperature;
wherein the temperature detection unit includes:
a first sensor voltage generation circuit which generates the voltage that increases linearly as a temperature increases from the low temperature;
a second sensor voltage generation circuit which generates the voltage that declines linearly as a temperature increases from the low temperature; and
a third sensor voltage generation circuit which generates the voltage onto which a prescribed clipping voltage is added, having the same gradient as the voltage generated by the first sensor voltage generation circuit;
wherein the temperature compensation voltage generation section includes:
a low-temperature control voltage generation section which generates the voltage that compensates a temperature characteristic of the piezoelectric element in a low temperature, where "low" indicates temperatures lower than a common temperature in the temperature characteristic of the piezoelectric element; and
a high-temperature control voltage generation section which generates the voltage that compensates the temperature characteristic of the piezoelectric element in a high temperature, where "high" indicates temperatures higher than a common temperature in the temperature characteristic of the piezoelectric element;

wherein the low-temperature control voltage generation section includes:
a low-temperature first-degree voltage generation circuit which generates the voltage that linearly changes, based on the second sensor voltage;
a low-temperature high-degree voltage generation circuit which generates the voltage that behaves like a high degree function in a low temperature state of the voltage generated by the low-temperature first-degree voltage generation circuit, based on the second sensor voltage and the third sensor voltage; and
a low-temperature voltage composite circuit which synthesizes voltages generated by the low-temperature first-degree voltage generation circuit and the low-temperature high-degree voltage generation circuit; and
wherein the high-temperature control voltage generation section includes:
a high-temperature first-degree voltage generation circuit which generates the voltage that linearly changes, based on the second sensor voltage;
a high-temperature high-degree voltage generation circuit which generates the voltage that behaves like a high degree function in a high temperature state of the voltage generated by the high-temperature first-degree voltage generation circuit, based on the first sensor voltage and the second sensor voltage; and
a high-temperature voltage composite circuit which synthesizes voltages generated by the high-temperature first-degree voltage generation circuit and the high-temperature high-degree voltage generation circuit.

4. The temperature-compensated piezoelectric oscillator, according to claim 3, wherein, in the low-temperature high-degree voltage generation circuit and the high-temperature high-degree voltage generation circuit, the degree of the function that represents the voltage is changeable.

5. The temperature-compensated piezoelectric oscillator, according to claim 1, wherein the low-temperature control voltage generation section generates the voltage that is constant in the temperature higher than a vicinity of the common temperature, and the high-temperature control voltage generation section generates the voltage that is constant in the temperature lower than the vicinity of the common temperature.

* * * * *